(12) United States Patent
Yang

(10) Patent No.: US 6,215,156 B1
(45) Date of Patent: Apr. 10, 2001

(54) ELECTROSTATIC DISCHARGE PROTECTION DEVICE WITH RESISTIVE DRAIN STRUCTURE

(75) Inventor: Jiuun-Jer Yang, Chin-Men Hsien (TW)

(73) Assignee: Taiwan Semiconductor Manufacturing Corporation, Hsinchu (TW)

( * ) Notice: Subject to any disclaimer, the term of this patent is extended or adjusted under 35 U.S.C. 154(b) by 0 days.

(21) Appl. No.: 09/365,186

(22) Filed: Aug. 2, 1999

(51) Int. Cl.$^7$ .............................. H01L 23/60; H01L 29/78
(52) U.S. Cl. .............................................. 257/360; 257/408
(58) Field of Search ........................................ 257/360, 408

(56) References Cited

U.S. PATENT DOCUMENTS

| | | | |
|---|---|---|---|
| 5,386,134 | * | 1/1995 | Huang .................................. 257/360 |
| 5,534,723 | * | 7/1996 | Iwai et al. ............................ 257/360 |
| 5,932,917 | * | 8/1999 | Miura .................................. 257/360 |
| 5,952,693 | * | 9/1999 | Wu et al. ............................. 257/408 |

* cited by examiner

*Primary Examiner*—Gene M. Munson
(74) *Attorney, Agent, or Firm*—Blakely Sokoloff Taylor & Zafman, LLP

(57) ABSTRACT

A transistor formed in a semiconductor substrate having improved ESD protection. The transistor includes a gate structure formed atop of a semiconductor substrate. First and second sidewall spacers are formed on the sidewalls of the gate structure. A lightly doped source region is formed in said semiconductor substrate and substantially underneath only the first sidewall spacer. A source region is formed in said semiconductor substrate and adjacent to the first sidewall spacer and a drain region is formed in said semiconductor substrate and adjacent to the second sidewall spacer. A first ESD implant is provided that overlaps the source region and extending underneath the first sidewall spacer. A second ESD implant is formed to overlap the drain region and extending underneath the second sidewall spacer. Preferably, the ESD implants are formed using an angled ion implantation technique.

4 Claims, 4 Drawing Sheets

ELECTROSTATIC DISCHARGE PROTECTION DEVICE WITH RESISTIVE DRAIN STRUCTURE

FIELD OF THE INVENTION

The present invention relates to an electrostatic discharge protection device, and more particularly, to a device that has a resistive drain structure.

BACKGROUND OF THE INVENTION

Electrostatic discharge (ESD) refers to a phenomena wherein a charged device of a given potential suddenly discharges carriers to a separate device of lower potential. The discharge occurs over a short time frame and, therefore, results in a momentarily large current, if the resistance of the discharge path is kept low. The most common example of ESD occurs when a human walks over a carpeted area in low humidity, thereby collecting an electrostatic charge. If the charged human touches a semiconductor device, an electrostatic discharge takes place from the human to elements of the semiconductor device. Such discharges can damage the semiconductor device unless means are provided for clamping the large voltages and diverting the currents resulting from the electrostatic discharge.

FIG. 1 shows a prior art schematic diagram of a typical electrostatic discharge protection circuit for IC input pads. An input pad 101 is provided for interface with the internal circuit 103 of the IC. Disposed between the input pad 101 and the internal circuit 103 are a pMOS 105 and an nMOS 107 which form the primary protection stage. An nMOS 109 serves as a secondary protection stage. The pMOS and nMOS devices have their gate electrodes connected to their sources.

Generally, an ESD pulse will generate a large amount of joule heating within the MOSFET devices. However, deep submicron devices utilize shallow junctions for better short channel effect control, which reduces the joule heating capability. Therefore, in order to reduce the maximum current density and provide a uniform current path, one prior art practice uses an ESD implant to broaden the source/drain profiles. Thus, as can be seen in FIG. 2, a conventional lightly doped drain MOSFET includes a gate 201, sidewall spacers 203, lightly doped drain regions 205, and source and drain implants 207 and 209, respectively. Additionally, an ESD implant 211 is used to broaden the source drain profiles. Typically, the ESD implant 211 is an implant having the same conductivity type of the source and drain, but of lower concentration. Therefore, the ESD implant 211 is a n-type implant and can be, for example, formed by phosphorous implants. Furthermore, although an nMOS device is shown in FIG. 2, a pMOS transistor can be easily formed by reversing the implant types. A more detailed discussion of this prior art may be found in A. Amerasekera and C. Duvvury, "ESD in Silicon Integrated Circuits," John Wiley and Sons, Inc. (1996), at page 180.

In order to provide enough ESD protection, the MOSFETs in FIG. 1 are designed as large width devices. The large width devices are implemented in a parallelized multi-finger gate configuration. The total gate width is about 300 $\mu$m, but will depend on device design. Several tradeoffs must be considered to determine the channel length of the MOSFETs. The shorter channel length device has better ESD performance, so that the total required width is smaller than would be required with longer channel length devices.

The major challenges of implementing shorter channel length devices in protection circuits are the controllability of uniformly turning on snapback operation for each gate finger and keeping off-state leakage current to a minimum to reduce power consumption. Therefore, usually designers choose longer channel length devices for the MOSFETs, although they sacrifice layout area. Recently, a circuit design technique referred to as the "gate-coupled technique" was proposed to improve the controllability of uniform turn on snapback operation for each gate finger. See Ming-Dou Ker et al., "Capacitor-Couple ESD Protection Circuit for Deep-Submicron Low-Voltage CMOS", IEEE Trans. on VLSI Systems, Vol. 4, No. 3, p. 307, Sept. 1996. However, this technique also requires more layout area for ESD protection triggering circuits.

Thus, what is needed is a device that can provide good ESD protection with a short channel length, resulting in reduced layout area.

SUMMARY OF THE INVENTION

A transistor formed in a semiconductor substrate having improved ESD protection is disclosed. The transistor comprises: a gate structure formed atop of said semiconductor substrate, said gate structure comprised of a conducting layer formed atop a thin gate oxide layer, said gate including a first and a second sidewall; a first sidewall spacer formed on said first sidewall of said gate structure; a second sidewall spacer formed on said second sidewall of said gate structure; a lightly doped source region formed in said semiconductor substrate and substantially underneath said first sidewall spacer; a source region formed in said semiconductor substrate and adjacent to said first sidewall spacer; a drain region for med in said semiconductor substrate and adjacent to said second sidewall spacer; a first ESD implant formed to overlap said source region and extending underneath said first sidewall spacer, said first ESD implant having the same impurity type as said source region; and a second ESD implant formed to overlap said drain region and extending underneath said second sidewall spacer, said second ESD implant having the same impurity type as said drain region.

BRIEF DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DETAILED DESCRIPTION OF THE PREFERRED EMBODIMENT

Figure 1:
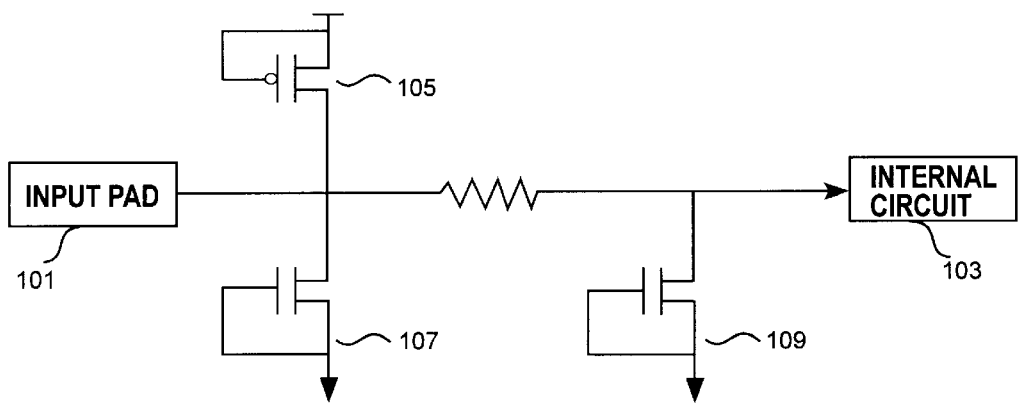
FIG. 1 is a schematic diagram of a prior art ESD protection circuit.
Figure 2:
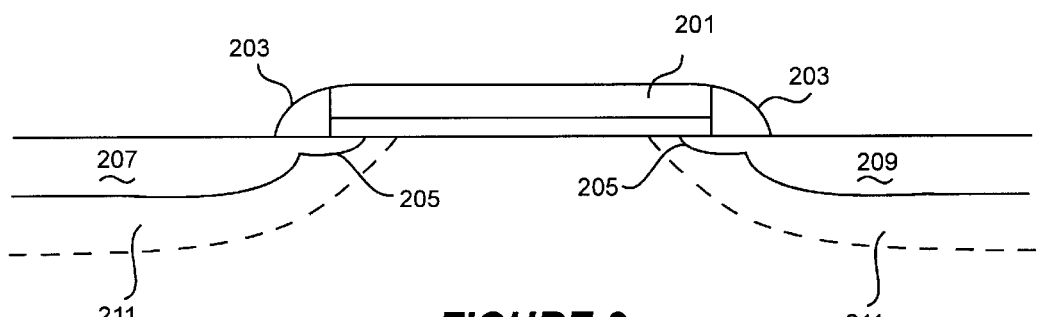
FIG. 2 is a cross section of a semiconductor substrate illustrating a prior art transistor designed to reduce ESD effects.
Figure 3:
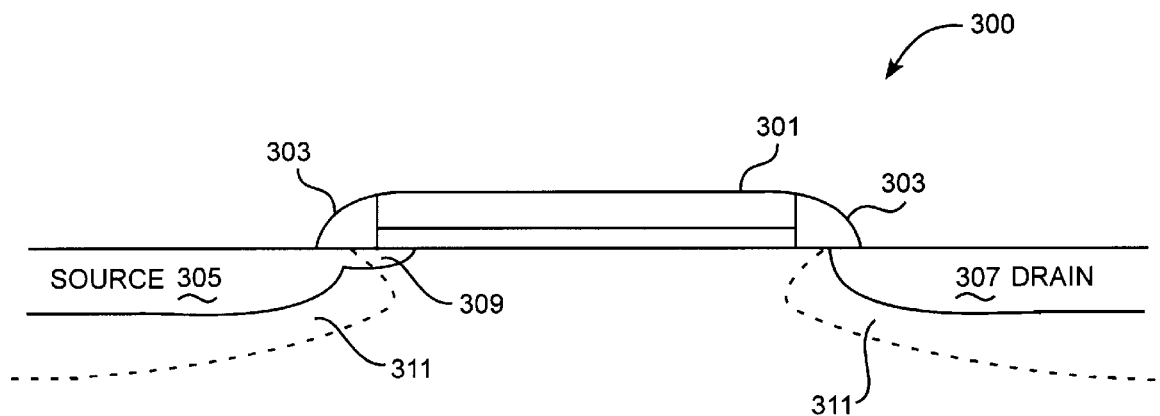
FIG. 3 is a schematic diagram of a MOSFET formed in accordance with the present invention.

FIG. 3 is a cross section view of a MOSFET 300 formed in accordance with the present invention. The MOSFET 300 includes a gate 301 and sidewall spacers 303. As is conventional in the prior art, the sidewall spacers 303 are used to form lightly doped drain (LDD) structures. Source and drain regions 305 and 307, respectively, are formed using ion implants. Typically, for a 0.5 micron nMOS, the thickness of the gate oxide is approximately 120 angstroms.

Note that a lightly doped source 309 is only formed on the source side 305, making the MOSFET device 300 asymmetrical. The lightly doped drain 309 is formed by phosphorous implantation with an energy of 60 Kev to a total dosage of $5 \times 10^{13}/cm^2$. The source and drain regions 305 and 307 are formed using, for example, an arsenic ion implant at an energy of 60 Kev to a dosage of $3 \times 10^{15}/cm^2$.

Next, a separate ion implant step is used to form ESD implants 311. The ESD implants 311 are used to minimize the joule heating effect and the impurity type is the same as the source and drain regions 305 and 307. As will be seen below, the ESD implants 311 may be formed using a large tilt-angle implantation technique. The ESD implants 311 are used to improve the drain side conductivity during device snapback operation. In this way, the MOSFET 300 can sufficiently sink out ESD current. Preferably, in one actual embodiment, the ESD implant 311 uses a phosphorous species at 50 Kev with a dosage of $6 \times 10^{13}/cm^2$.

There are several points about the MOSFET 300 of the present invention that merit comment. First, the gate length can be made as small as the most current technology will allow. Because there is a discontinuity in the surface conduction region under the drain side spacer, the off-state leakage current is nearly eliminated.

Second, good ESD performance can be achieved due to the use of the small gate length device. The controllability of the uniform turn-on of each gate finger can be improved by the resistive region under the drain side spacer. The resistive drain side can delay the device during snapback operation; therefore, turn on controllability is enhanced.

Third, because the minimum channel length device is used and no additional circuit is required to uniformly trigger the device into snapback operation, the total required layout area can be reduced.

Fourth, the MOSFET 100 is very suitable for dual power supply (or multi-power supply) circuits. Since there are different performance and reliability considerations for different power supply devices, in the past, an additional mask (known as a HVLDD mask) is used to form the LDD region of high voltage devices. We can utilize the HVLDD mask to form the asymmetric source/drain profiles. There is no extra mask needed to fabricate the disclosed device of the present invention.

Fifth, for salicide processes, since there is a resistive region at the drain side, the rule of gate-to-drain contact spacing for salicide block mask can be reduced. The layout area can further be reduced.

Turning to FIGS. 4–7, schematic cross sections illustrating the method of forming the MOSFET 300 is shown. It should be noted that FIGS. 4–7 illustrate the formation of a NMOS, but a pMOS can just as easily be formed by reversing the conductivity/dopant types.

Figure 4:
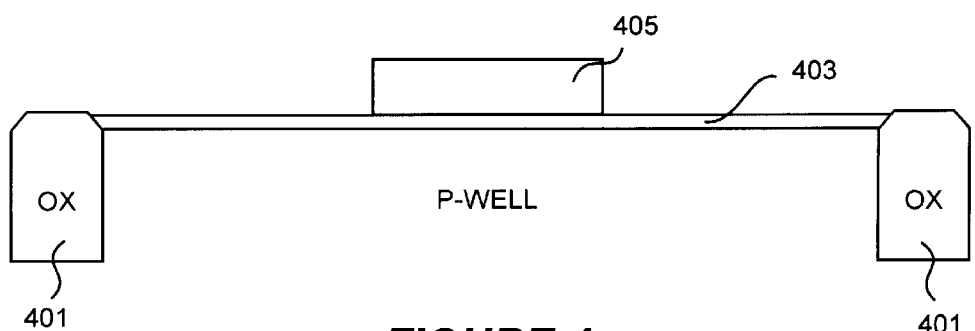
FIGS. 4–7 are cross section views of a semiconductor substrate illustrating the steps in making the MOSFET of FIG. 3.

First, in FIG. 4, oxide isolation regions 401 are used to define the active area of the MOSFET 300. Preferably, the oxide isolation regions 401 are shallow trench isolations. A p-well is also formed in the substrate (to form the active area) between the isolation regions. After the p-well is formed, a gate oxide 403 is formed atop of the substrate. For a 0.25 µm process with a 2.5 volt power supply for the core circuits and a 5 volt supply for peripheral circuits, the gate oxide 403 is preferably between 50 and 125 angstroms thick and is formed by thermal oxidation or CVD. Next, a gate 405 is formed above the gate oxide 403. Preferably, the gate 405 is formed from in-situ doped polysilicon.

Figure 5:
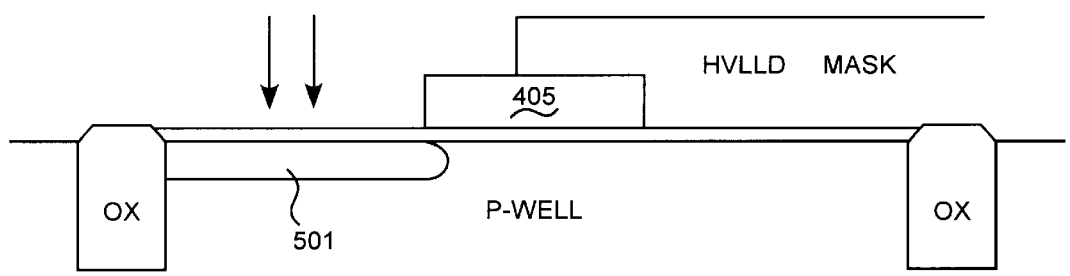

Turning to FIG. 5, an asymmetric HVLDD mask is used to form a lightly doped drain 501 on the source side of the gate 405. In the preferred embodiment, the lightly doped drain 501 is formed by phosphorous implant with an energy of 60 KeV to a total dosage of about $5 \times 10^{13}/cm^2$.

Figure 6:
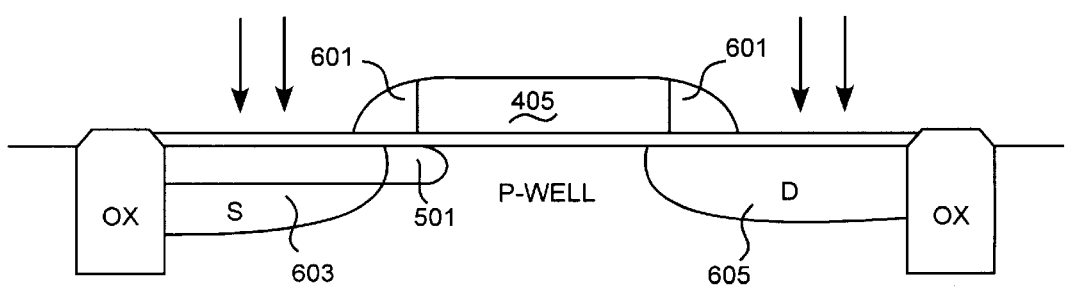

Next, turning to FIG. 6, the source 603 and drain 605 regions are formed using an ion implant. Preferably, The source and drain regions 603 and 605 are formed using, for example, an arsenic ion implant at an energy of 60 Kev to a dosage of $3 \times 10^{15}/cm^2$.

Figure 7:
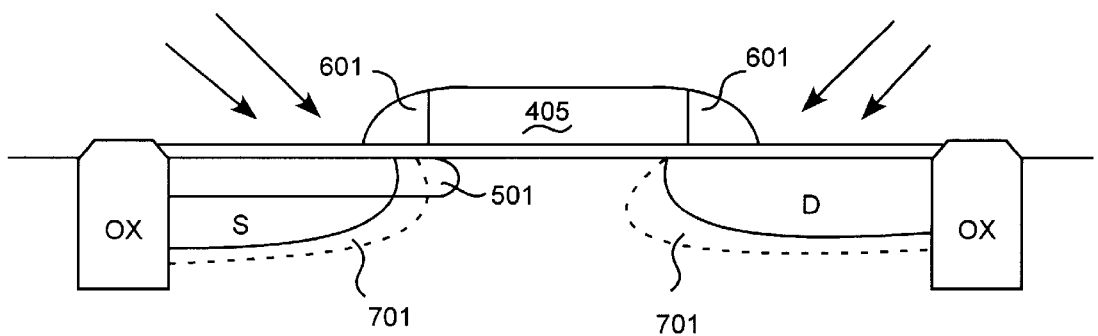

Finally, turning to FIG. 7, ESD implants 701 are formed in the substrate. Preferably, in one actual embodiment, the ESD implants 701 are formed from a phosphorous species at 50 Kev with a dosage of $6 \times 10^{13}/cm^2$. Additionally, an implant angle of 45 degrees is used to extend the ESD regions 701 under the sidewall spacers 601.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A transistor formed in a semiconductor substrate having improved electrostatic discharge (ESD) protection comprising:
   a gate structure formed atop of said semiconductor substrate said gate structure comprised of a conducting layer formed atop a thin gate oxide layer said gate including a first and a second sidewall;
   a first sidewall spacer formed on said first sidewall of said gate structure;
   a second sidewall spacer formed on said second sidewall of said gate structure;
   a lightly doped source region formed in said semiconductor substrate and substantially underneath said first sidewall spacer;
   a source region formed in said semiconductor substrate and adjacent to said first sidewall spacer;
   a drain region formed in said semiconductor substrate and adjacent to said second sidewall spacer;
   a first ESD implant formed to overlap said source region and extending underneath said first sidewall spacer, said first ESD implant having the same impurity type as said source region; and
   a second ESD implant formed to overlap said drain region and extending underneath said second sidewall spacer, said second ESD implant having the same impurity type as said drain region, wherein said first ESD implant and said second ESD implant are formed using an angled ion implantation process.

2. The transistor of claim 1 wherein said first ESD implant and said second ESD implant are formed using an angled ion implantation process having an angle of about 45 degrees.

3. The transistor of claim 1 wherein said first ESD implant and said second ESD implant are formed by a phosphorous dopant formed at an energy of 50 KeV to a concentration of $6 \times 10^{13}/cm^2$.

4. A transistor formed in a semiconductor substrate having improved electrostatic discharge (ESD) protection comprising:
   a gate structure formed atop of said semiconductor substrate, said gate structure comprised of a conducting layer formed atop a thin gate oxide layer, said gate including a first and a second sidewall;
   a first sidewall spacer formed on said first sidewall of said gate structure;
   a second sidewall spacer formed on said second sidewall of said gate structure;

a lightly doped source region formed in said semiconductor substrate and substantially underneath said first sidewall spacer;

a source region formed in said semiconductor substrate and adjacent to said first sidewall spacer;

a drain region formed in said semiconductor substrate and adjacent to said second sidewall spacer;

a first ESD implant formed to overlap said source region and extending underneath said first sidewall spacer, said first ESD implant having the same impurity type as said source region and being formed from an angled ion implant process at about 45 degrees, said first ESD implant having a dopant concentration of about $6\times10^{13}/cm^2$ and an implant energy of about 50 KeV; and a second ESD implant formed to overlap said drain region and extending underneath said second sidewall spacer, said second ESD implant having the same impurity type as said drain region and being formed from an angled ion implant process at about 45 degrees, said second ESD implant having a dopant concentration of about $6\times10^{13}/cm^2$ and an implant energy of about 50 KeV.

* * * * *